US007641776B2

(12) United States Patent
Nagar et al.

(10) Patent No.: US 7,641,776 B2
(45) Date of Patent: Jan. 5, 2010

(54) SYSTEM AND METHOD FOR INCREASING YIELD FROM SEMICONDUCTOR WAFER ELECTROPLATING

(75) Inventors: Mohan Nagar, Milpitas, CA (US); Shirish Shah, Milpitas, CA (US)

(73) Assignee: LSI Corporation, Milpitas, CA (US)

( * ) Notice: Subject to any disclaimer, the term of this patent is extended or adjusted under 35 U.S.C. 154(b) by 926 days.

(21) Appl. No.: 11/078,179

(22) Filed: Mar. 10, 2005

(65) Prior Publication Data

US 2006/0201802 A1 Sep. 14, 2006

(51) Int. Cl.
*C25D 7/00* (2006.01)
*C25D 21/00* (2006.01)
*C25D 5/00* (2006.01)

(52) U.S. Cl. .................... 204/297.01; 204/297.07; 204/297.08; 205/157

(58) Field of Classification Search ............ 204/297.01, 204/297.07, 297.08; 205/157
See application file for complete search history.

(56) References Cited

U.S. PATENT DOCUMENTS 6,242,337 B1 * 6/2001 Okada ..................... 438/622
7,294,243 B2 * 11/2007 Zimmerman et al. .... 204/224 R

* cited by examiner

*Primary Examiner*—Harry Wilkins
*Assistant Examiner*—Zulmariam Mendez
(74) *Attorney, Agent, or Firm*—William W. Cochran; Cochran Freund & Young LLC

(57) ABSTRACT

A system and method increase yield from semiconductor wafer electroplating. The aspects include a semiconductor wafer, the semiconductor wafer comprising a plurality of die areas. A plating ring for holding the semiconductor wafer in position during electroplating is also included, the plating ring substantially surrounding a circumference of the semiconductor wafer and having a width that varies in order to avoid overlap near edge die areas of the semiconductor wafer.

20 Claims, 3 Drawing Sheets

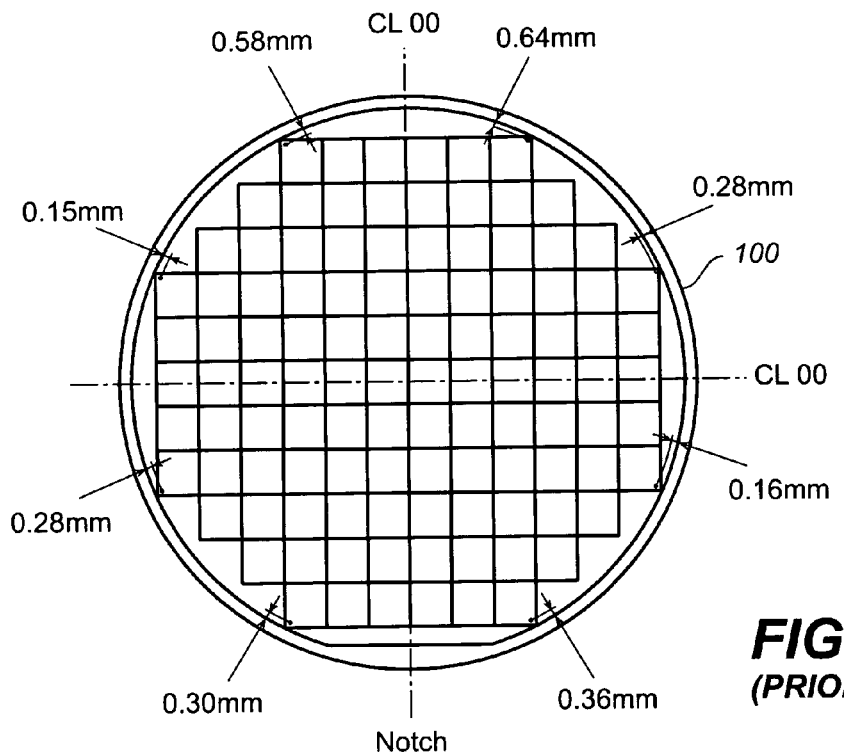
FIG._1a
*(PRIOR ART)*
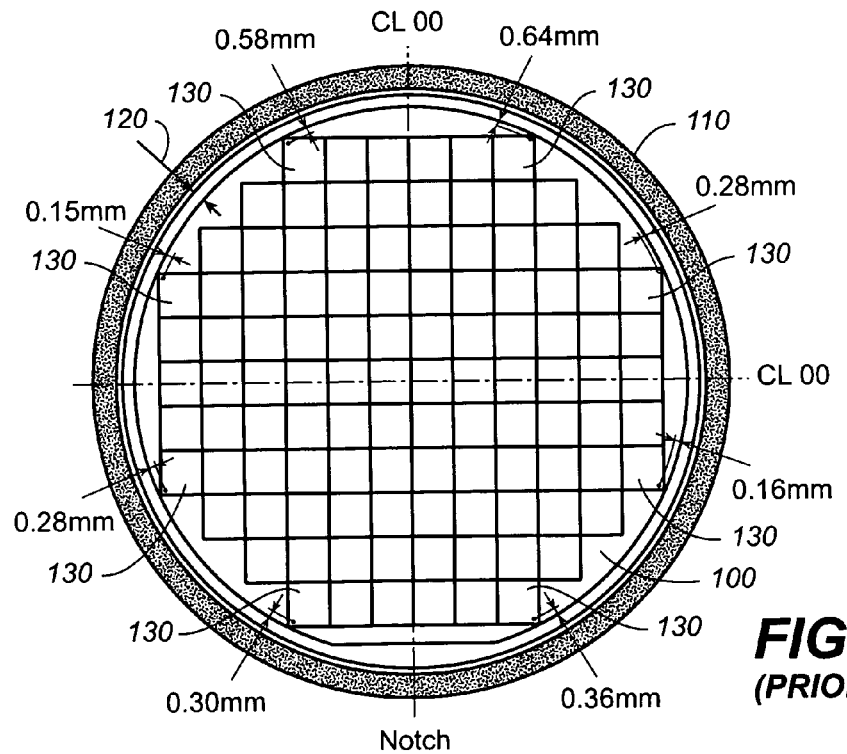
FIG._1b
*(PRIOR ART)*

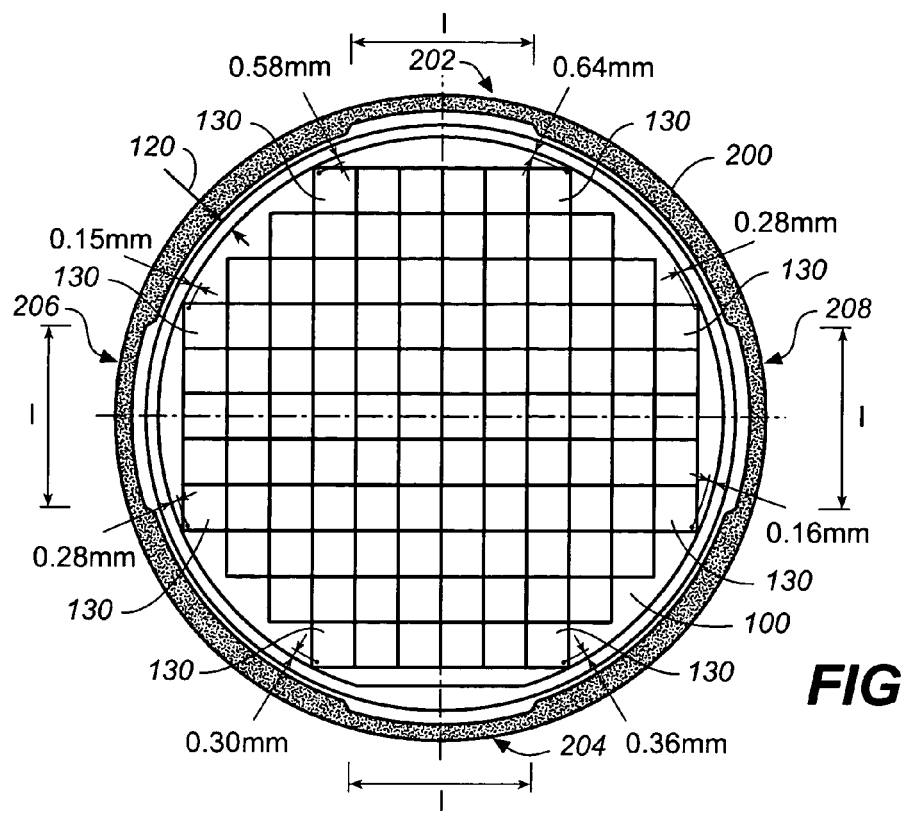
FIG._2a
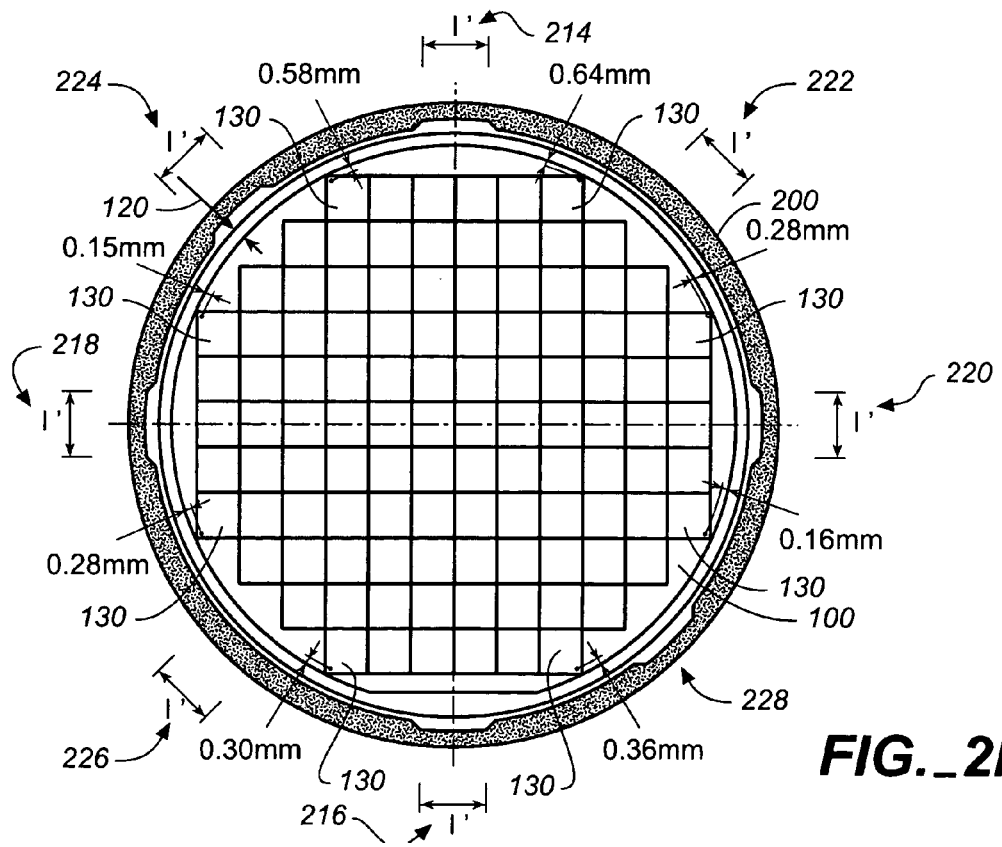
FIG._2b

Standard vs. Selective Process Flow

| Standard Flow | Selective Flow |
|---|---|
| Incoming Inspect | Incoming Inspect |
| Incoming Clean | Incoming Clean |
| Sputter Clean | Sputter Clean |
| Sputter Ti/Cu Seed Layers | Sputter TiW/Cu Seed Layers |
| Plating Template Coat | Plating Template Coat |
| Expose and Develop | Expose and Develop |
| Plate Ni | Plate Ni |
| Plate Eutectic | Plate Eutectic |
| Strip Resist | Strip Resist |
| Cu Etch | Cu Etch |
| Ti Etch-HF Based | TiW Etch-Non HF Based |
| Flux/Reflow/Clean | Flux/Reflow/Clean |
| Inspection | Inspection |

FIG. _3 (PRIOR ART)

SYSTEM AND METHOD FOR INCREASING YIELD FROM SEMICONDUCTOR WAFER ELECTROPLATING

FIELD OF THE INVENTION

The present invention relates to semiconductor wafer electroplating processes, and more particularly to increasing die yield from semiconductor wafer electroplating processes.

BACKGROUND OF THE INVENTION

As is commonly understood in the art, the fabrication of microcircuits requires the precise positioning of a number of appropriately doped regions in a semiconductor wafer, followed by effectuation of one or more interconnection patterns. These appropriately doped regions typically include a variety of diffusions and implants, cuts for metallizations and gates, and areas by which connections can be made to bonding pads. For each of these regions a sequence of steps is required, together with a specific pattern layout.

A common method of patterning heretofore has involved a photolithographic transfer followed by etching. As is well known to those skilled in the art, photolithography effects transfer of a desired pattern onto the surface of a silicon wafer by selectively allowing light to strike a thin film of photosensitive material coated on the wafer, certain of which material can then be locally removed based upon its solubility, changed or unchanged, after exposure to the light. Removal of material from areas unprotected by the photosensitive material or "photoresist" is accomplished in an etching step. The etching processes used in integrated circuit ("IC") fabrication can take place either in a liquid ("wet etching") or gas ("dry etching") phase. These processes can also be purely physical (e.g., wherein material is removed by bombardment which high-energy ions), purely chemical (e.g., wherein material is removed by dissolution), or a combination of both (e.g., wherein material is removed by bombardment with reactive ions which also react chemically with the etched material). Recognizing that all etching processes may be characterized by their selectivity (i.e., in materials attacked by the etching agent) and degree of anisotropy (i.e., etching in one direction only, as opposed to isotropic etching, wherein material is removed at the same rate in all directions), it should be appreciated that all etching processes involve some degree of compromise in selectivity, anisotropy, or both selectivity and anisotropy.

As it has become desired to create increasingly accurate and dense pattern geometries, those skilled in the art have searched for methods of patterning that lack the "bias-type" compromises of etching processes. One such method that has been developed is electroplating, that is, the electrodeposition of an adherent coating upon an object. One of the advantages of additive patterning approaches, such as pattern electroforming, over subtractive methods, such as etching, that has been discovered is that very little bias in dimension occurs with electroforming and therefore very accurate and dense geometries can be fabricated.

One of the patterning processes that has evolved to employ electroplating techniques is flip-chip processing. In order to help ensure proper performance during the electroplating, positioning of the wafer involves securing the wafer in position during the processing. In the standard approaches, a metal plating ring the circumference of a wafer and is used to help secure the wafer in position during the electroplating. FIG. 1a illustrates a representation of a top view of an example of a standard wafer 100, while FIG. 1b illustrates a standard plating ring 110 that surrounds the wafer 100. When positioned within the plating ring 110, there is some amount of overlap by the plating ring 110 on the outside edge of the wafer 100. Such overlapping can adversely affect the plating process. For example, in flip-chip processing, the formation of the solder bumps is adversely affected, including causing defects in the form of missing bumps, small bumps, and deformed bumps. These defects are seen most often in the areas of the corner dies 130 (individual die areas being represented by squares in the figures). As a result of these problems, the affected dies are unusable and yield loss is incurred on every wafer.

Accordingly, a need exists for a system and method of increasing die yield from semiconductor wafer electroplating. The present invention meets such a need.

BRIEF SUMMARY OF THE INVENTION

Aspects of a system and method for increasing yield from semiconductor wafer electroplating are described. The aspects include a semiconductor wafer, the semiconductor wafer comprising a plurality of die areas. A plating ring for holding the semiconductor wafer in position during electroplating is also included, the plating ring substantially surrounding a circumference of the semiconductor wafer and having a width that varies in order to avoid overlap near edge die areas of the semiconductor wafer.

Through the present invention, a plating ring with a plurality of portions having less than a maximum ring width is provided. With the positioning of the plating ring such that overlap near edge die areas of the semiconductor wafer is avoided, potential for defects on the edge dies is reduced. In this manner, yield loss problems associated with the edge dies are addressed in a straightforward and effective approach.

BRIEF DESCRIPTION OF SEVERAL VIEWS OF THE DRAWINGS

FIG. 1a illustrates a top view of an example of a standard wafer.

FIG. 1b illustrates a standard plating ring surrounding the wafer of FIG. 1a.

FIGS. 2a and 2b illustrate two embodiments of a plating ring in accordance with the present invention.

FIG. 3 illustrates a table of steps for standard and selective process flows that utilize electroplating in which the plating ring of the present invention can find application.

DETAILED DESCRIPTION OF THE INVENTION

The present invention relates to increasing die yield from semiconductor wafer electroplating processes. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

In accordance with the present invention, a plating ring for use during electroplating processing for wafer bumping is provided that reduces the number of defects in edge dies on the wafer and thus increases yield. In a preferred embodiment, the plating ring of FIG. 1b is altered to reduce the deleterious impact on the dies of the wafer. Typically, the plating ring 110 has a width of about 5 mm (millimeters), while the wafer 100 includes an outside edge 120 of about 3 mm. The alteration performed is to vary the width of the ring from about 5 mm to about 3 mm along portions of the ring. The reduction in width can be achieved through any desired and appropriate techniques, e.g., by simply cutting out about 2 mm from a standard width ring, as is well understood in the art. The width provided in the altered ring maintains the ability to support the edge of the wafer but overlaps less deeply on the wafer near the edge dies in order to avoid bump defects on those dies. Examples of alternate embodiments of the altered ring are presented in FIGS. 2a and 2b.

Referring to FIG. 2a, a plating ring 200 has a reduced width at portions 202, 204, 206, 208 corresponding to the edge areas at a top-most, bottom-most, left-most and right-most sections of the wafer 210. As shown, the reduced width at the indicated portions runs a length, l, that substantially corresponds with the distance spanned by the dies on that section of the wafer 210.

Referring to FIG. 2b, the plating ring 212 has a reduced width at portions 214, 216, 218, 220, 222, 224, 226, and 228 corresponding to the edge areas at the top-most, bottom-most, left-most and right-most sections of the wafer 210, as well as portions approximately half-way between these sections. The greater number of portions of reduced width in FIG. 2b, as compared with FIG. 2a, allows the portions of reduced width in FIG. 2b to run a shorter length, l'.

In the use of electroplating for flip-chip processing, less defects in the form of missing bumps, small bumps, and deformed bumps result. By way of example, referring to FIG. 3, a table 300 is provided listing the steps of flip-chip processing flows during which electroplating is used. The right-hand side of the table provides steps of a typical selective process, while the left-hand side provides steps of a standard process, as is well appreciated by those skilled in the art. By reducing the ring width near edge dies on a wafer in accordance with the present invention, overlap near those dies is reduced during plating steps in the processing flows. In this manner, potential for defects on those dies during electroplating is lessened, and yield loss problems are addressed in a straightforward and effective approach.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

We claim:

1. A system for increasing yield from semiconductor wafer electroplating, the system comprising:
a plating ring for holding a semiconductor wafer in position during electroplating, the semiconductor wafer comprising a plurality of die areas, the plating ring substantially surrounding a circumference of the semiconductor wafer and overlapping an outside edge of the semiconductor wafer when the semiconductor wafer is positioned within the plating ring, the plating ring having a width that varies, the width narrowing near edge die areas of the semiconductor wafer to reduce overlap by the plating ring near edge die areas of the semiconductor wafer when the semiconductor wafer is positioned within the plating ring.

2. The system of claim 1 wherein the plating ring further comprises a plurality of portions having less than a maximum ring width.

3. The system of claim 2 wherein the plurality of portions further comprises four portions.

4. The system of claim 3 wherein the four portions avoid overlap with edge die areas on a top-most, bottom-most, left-most, and right-most section of the semiconductor wafer.

5. The system of claim 2 wherein the plurality of portions further comprises eight portions.

6. The system of claim 5 wherein the eight portions avoid overlap with edge die areas on a top-most, bottom-most, left-most, and right-most section of the semiconductor wafer, as well as edge die areas on sections approximately half-way between the top-most, bottom-most, left-most, and right-most sections of the semiconductor wafer.

7. The system of claim 1 wherein the plating ring has a width that varies between approximately 5 millimeters and approximately 3 millimeters.

8. A method for increasing yield from semiconductor wafer electroplating, the method comprising:
providing a plating ring with a plurality of portions having less than a maximum ring width; and
utilizing the plating ring for holding a semiconductor wafer in position during electroplating, the plating ring substantially surrounding a circumference of the semiconductor wafer and overlapping an outside edge of the semiconductor wafer when the semiconductor wafer is positioned within the plating ring during electroplating, the plurality of portions positioned near edge die areas of the semiconductor wafer to reduce overlap by the plating ring near edge die areas of the semiconductor wafer when the semiconductor wafer is positioned within the plating ring during electroplating.

9. The method of claim 8 wherein the plurality of portions further comprises four portions.

10. The method of claim 9 wherein the four portions avoid overlap with edge die areas on a top-most, bottom-most, left-most, and right-most sections of the semiconductor wafer.

11. The method of claim 8 wherein the plurality of portions further comprises eight portions.

12. The method of claim 11 wherein the eight portions avoid overlap with edge die areas on a top-most, bottom-most, left-most, and right-most sections of the semiconductor wafer, as well as edge die areas on sections approximately half-way between the top-most, bottom-most, left-most, and right-most sections of the semiconductor wafer.

13. The method of claim 8 wherein the maximum width further comprises a width of approximately 5 millimeters.

14. The method of claim 13 wherein each of the plurality of portions comprises a width of approximately 3 millimeters.

15. An apparatus for use in holding a semiconductor wafer in position during electroplating, the apparatus comprising:
a plating ring having a plurality of reduced width portions, the plating ring substantially surrounding a circumference of a semiconductor wafer and overlapping an outside edge of the semiconductor wafer when the semiconductor wafer is positioned within the plating ring, the plurality of reduced width portions positioned to reduce overlap by the plating ring near edge die areas of the semiconductor wafer when the semiconductor wafer is positioned within the plating ring to increase die yield.

16. The apparatus of claim 15 wherein the plurality of reduced width portions further comprises four portions.

17. The apparatus of claim 16 wherein the four portions avoid overlap with edge die areas on a top-most, bottom-most, left-most, and right-most sections of the semiconductor wafer.

18. The apparatus of claim 15 wherein the plurality of reduced width portions further comprises eight portions.

19. The apparatus of claim 18 wherein the eight portions avoid overlap with edge die areas on a top-most, bottom-most, left-most, and right-most sections of the semiconductor wafer, as well as edge die areas on sections approximately half-way between the top-most, bottom-most, left-most, and right-most sections of the semiconductor wafer.

20. The apparatus of claim 15 wherein each of the plurality of reduced width portions comprises a width of approximately 3 millimeters.

* * * * *